(12) United States Patent
Gasner et al.

(10) Patent No.: US 8,569,896 B2
(45) Date of Patent: Oct. 29, 2013

(54) ACTIVE AREA BONDING COMPATIBLE HIGH CURRENT STRUCTURES

(75) Inventors: John T. Gasner, Satellite Beach, FL (US); Michael D. Church, Canyon Lake, FL (US); Sameer D. Parab, Fremont, CA (US); Paul E. Bakeman, Jr., South Burlington, VT (US); David A. Decrosta, Melbourne, FL (US); Robert Lomenick, Palm Bay, FL (US); Chris A. McCarty, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 13/532,843

(22) Filed: Jun. 26, 2012

(65) Prior Publication Data

US 2012/0261836 A1    Oct. 18, 2012

Related U.S. Application Data

(60) Continuation of application No. 12/825,030, filed on Jun. 28, 2010, now Pat. No. 8,274,160, which is a continuation of application No. 11/737,392, filed on Apr. 19, 2007, now Pat. No. 7,795,130, which is a continuation of application No. 11/305,987, filed on Dec. 19, 2005, now Pat. No. 7,224,074, which is a division of application No. 10/698,184, filed on Oct. 31, 2003, now Pat. No. 7,005,369.

(60) Provisional application No. 60/507,539, filed on Sep. 30, 2003, provisional application No. 60/496,881, filed on Aug. 21, 2003.

(51) Int. Cl.
*H01L 23/48* (2006.01)
*H01L 21/44* (2006.01)

(52) U.S. Cl.
USPC ........... 257/779; 257/780; 257/786; 438/612; 438/614

(58) Field of Classification Search
USPC .......... 438/614, 618, 622, 624; 257/779–781, 257/786, 758
See application file for complete search history.

(56) References Cited

U.S. PATENT DOCUMENTS

| | | | |
|---|---|---|---|
| 4,695,868 | A | 9/1987 | Fisher |
| 4,893,151 | A | 1/1990 | Yamazaki et al. |

(Continued)

FOREIGN PATENT DOCUMENTS

| | | |
|---|---|---|
| JP | 08293523 | 5/1996 |
| JP | 10064945 | 6/1998 |

(Continued)

OTHER PUBLICATIONS

Anderson et al., "ESD Protection Under Wire Bonding Pads", 1999, pp. 2A4.1-2A4.7, Publisher: EOS/ESD Symposium.

(Continued)

*Primary Examiner* — Hsien Ming Lee
(74) *Attorney, Agent, or Firm* — Fogg & Powers LLC

(57) ABSTRACT

A semiconductor structure comprises a top metal layer, a bond pad formed on the top metal layer, a conductor formed below the top metal layer, and an insulation layer separating the conductor from the top metal layer. The top metal layer includes a sub-layer of relatively stiff material compared to the remaining portion of the top metal layer. The sub-layer of relatively stiff material is configured to distribute stresses over the insulation layer to reduce cracking in the insulation layer.

19 Claims, 9 Drawing Sheets

(56) References Cited

U.S. PATENT DOCUMENTS

| | | | |
|---|---|---|---|
| 5,404,045 | A | 4/1995 | Mizushima |
| 5,726,497 | A | 3/1998 | Chao et al. |
| 5,916,453 | A | 6/1999 | Beilin et al. |
| 6,100,589 | A | 8/2000 | Tanaka |
| 6,133,054 | A | 10/2000 | Henson |
| 6,198,170 | B1 | 3/2001 | Zhao |
| 6,229,221 | B1 | 5/2001 | Kloen et al. |
| 6,261,944 | B1 | 7/2001 | Mehta |
| 6,417,575 | B2 | 7/2002 | Harada et al. |
| 6,534,870 | B1 | 3/2003 | Shimooka |
| 6,538,326 | B2 | 3/2003 | Shimizu et al. |
| 6,577,017 | B1 | 6/2003 | Wong |
| 6,656,329 | B1 | 12/2003 | Ma et al. |
| 6,730,590 | B2 | 5/2004 | Ohashi et al. |
| 6,795,675 | B2 | 9/2004 | Fujita |
| 6,921,979 | B2 | 7/2005 | Downey et al. |
| 6,963,138 | B2 | 11/2005 | Low et al. |
| 7,005,369 | B2 | 2/2006 | Gasner et al. |
| 7,224,074 | B2 | 5/2007 | Gasner et al. |
| 7,262,513 | B2 | 8/2007 | Mathew |
| 7,288,845 | B2 | 10/2007 | Sutardja et al. |
| 7,385,289 | B2 | 6/2008 | Suzuki |
| 7,482,693 | B2 | 1/2009 | Lin |
| 7,498,255 | B2 | 3/2009 | Lin |
| 7,521,812 | B2 | 4/2009 | Lee et al. |
| 7,795,130 | B2 | 9/2010 | Gasner et al. |
| 8,274,160 | B2 | 9/2012 | Gasner et al. |
| 2001/0000928 | A1 | 5/2001 | Lee et al. |
| 2002/0011674 | A1 | 1/2002 | Efland et al. |
| 2002/0179991 | A1 | 12/2002 | Varrot et al. |
| 2003/0045088 | A1 | 3/2003 | Imai et al. |
| 2003/0080428 | A1 | 5/2003 | Izumitani et al. |
| 2003/0108778 | A1 | 6/2003 | Okada et al. |
| 2004/0016949 | A1 | 1/2004 | Semi |
| 2007/0187837 | A1 | 8/2007 | Gasner et al. |
| 2013/0130445 | A1 | 5/2013 | Gasner et al. |

FOREIGN PATENT DOCUMENTS

| | | |
|---|---|---|
| JP | 10242204 | 9/1998 |
| JP | 2001351920 | 12/2001 |
| JP | 2002110731 | 12/2002 |

OTHER PUBLICATIONS

Anderson et al., "Reliability considerations for ESD protection under wire bonding pads", 2001, pp. 367-373, Publisher: Microelectronics Reliability 41.

Ching et al., "Bond Pad Structure Reliability", "Texas Instruments Inc.", 1998, pp. 64-70, Publisher: IEEE.

Heinen, "Wire Bonds Over Active Circuits", "XP-002637124", 1994, pp. 922-928, Publisher: Texas Instruments, Inc.

Chinese Patent Office, "Office Action", "from Foreign Counterpart of U.S. Appl. No. 10/698,184", Apr. 2, 2013, pp. 1-8, Published in: CN.

U.S. Patent and Trademark Office, "Office Action", "U.S. Appl. No. 13/717,942", Apr. 10, 2013, pp. 1-30.

Japan Patent Office, "Appeal Trial Decision", "from Foreign Counterpart of U.S. Appl. No. 10/698,184", Apr. 23, 2013, pp. 1-3, Published in: JP.

Chinese Patent Office, "First Office Action", "from Foreign Counterpart of U.S. Appl. No. 10/698,184", Dec. 21, 2007, pp. 1-18, Published in: CN.

Chinese Patent Office, "First Office Action", "from Foreign Counterpart of U.S. Appl. No. 10/698,184", Apr. 9, 2012, pp. 1-3, Published in: CN.

Chinese Patent Office, "Second Office Action", "from Foreign Counterpart of U.S. Appl. No. 11/737,395", Jan. 4, 2013, pp. 1-11, Published in: CN.

European Patent Office, "Office Action", "from Foreign Counterpart of U.S. Appl. No. 10/698,184", Sep. 18, 2008, pp. 1-4, Published in: EP.

European Patent Office, "Office Action", "from Foreign Counterpart of U.S. Appl. No. 10/698,184", Apr. 13, 2011, pp. 1-5, Published in: EP.

European Patent Office, "Office Action", "from Foreign Counterpart of U.S. Appl. No. 10/698,184", Feb. 1, 2012, pp. 1-6, Published in: EP.

European Patent Office, "Extended European Search Report", "from Foreign Counterpart of U.S. Appl. No. 10/698,184", May 26, 2011, pp. 1-7, Published in: EP.

Japan Patent Office, "Decision of Refusal", "from Foreign Counterpart of U.S. Appl. No. 10/698,184", Nov. 15, 2011, pp. 1-6, Published in: JP.

Japan Patent Office, "Decision of Refusal", "from Foreign Counterpart of U.S. Appl. No. 10/698,184", May 10, 2011, pp. 1-7, Published in: JP.

Japan Patent Office, "Notification of Reasons For Rejection", "from Foreign Counterpart of U.S. Appl. No. 11/737,395", Jan. 29, 2013, pp. 1-6, Published in: JP.

Korean Intellectual Property Office, "Office Action", "from Foreign Counterpart of U.S. Appl. No. 10/698,184", Feb. 13, 2008, pp. 1-32, Published in: KR.

Korean Intellectual Property Office, "Office Action", "from Foreign Counterpart of U.S. Appl. No. 10/698,184", Apr. 27, 2010, pp. 1-5, Published in: KR.

International Preliminary Examining Authority, "International Preliminary Report on Patentability", "from Foreign Counterpart of U.S. Appl. No. 10/698,184", Mar. 2, 2006, pp. 1-13, Published in: WO.

International Searching Authority, "International Search Report and Written Opinion", "from Foreign Counterpart of U.S. Appl. No. 10/698,184", Mailed Feb. 7, 2005, pp. 1-20, Published in: WO.

Chinese Patent Office, "Notification of Reexamination", "from Foreign Counterpart of U.S. Appl. No. 10/698,184", Jun. 17, 2013, pp. 1-19, Published in: CN.

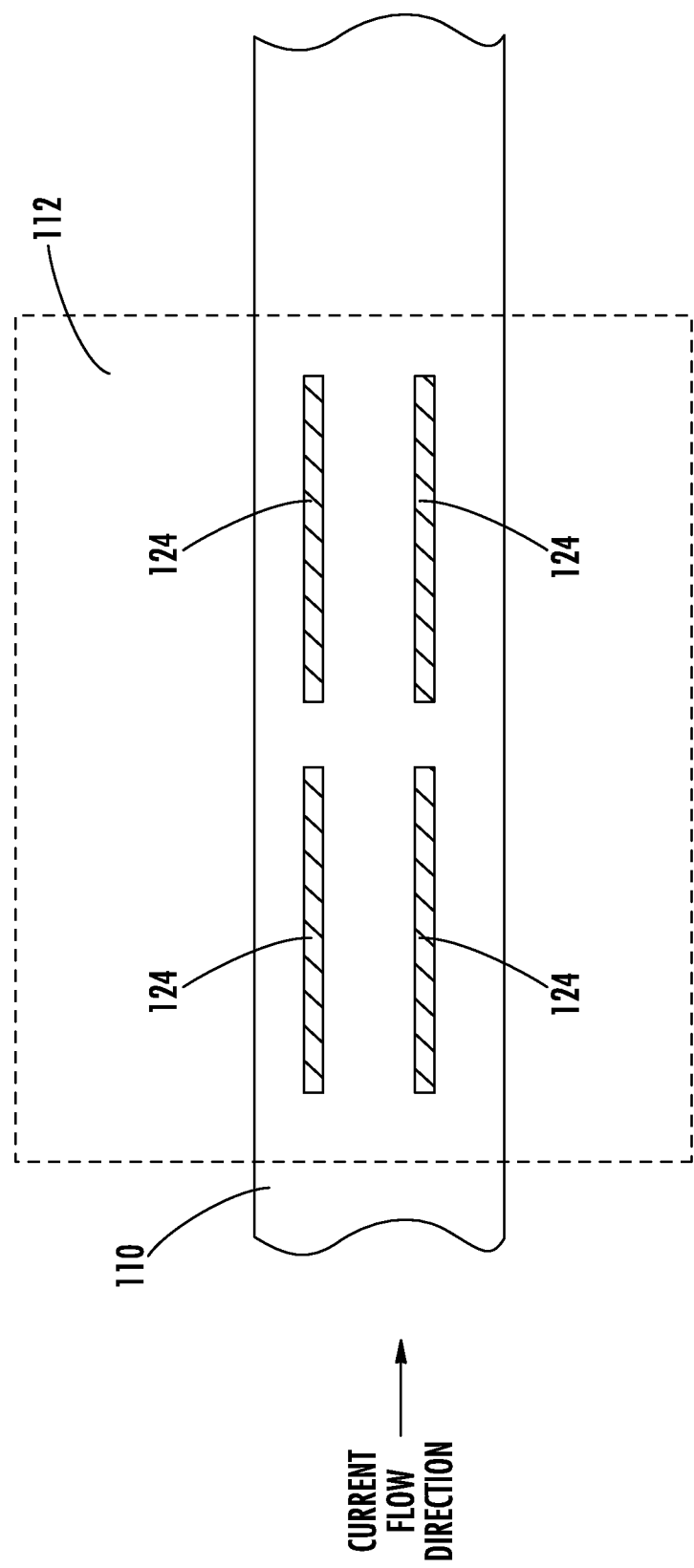

ACTIVE AREA BONDING COMPATIBLE HIGH CURRENT STRUCTURES

This application is a continuation of prior U.S. patent application Ser. No. 12/825,030 filed Jun. 28, 2010, which is a continuation of U.S. patent application Ser. No. 11/737,392 filed Apr. 19, 2007, now U.S. Pat. No. 7,795,130, which is a continuation of Ser. No. 11/305,987, filed Dec. 19, 2005, now U.S. Pat. No. 7,224,074, which is a divisional of prior patent application Ser. No. 10/698,184, filed Oct. 31, 2003, now U.S. Pat. No. 7,005,369, which claims the benefit under 35 U.S.C. §119(e) of U.S. Provisional Application Ser. No. 60/496,881, filed Aug. 21, 2003, and U.S. Provisional Application Ser. No. 60/507,539, filed Sep. 30, 2003, all of which are incorporated herein by reference in their entirety.

TECHNICAL FIELD

The present invention relates generally to the formation of semiconductor devices and in particular a formation of active circuits under a bond pad.

BACKGROUND

Integrated circuits comprise two or more electronic devices formed in and/or on a substrate of semi-conductive material. Typically, the integrated circuits include two or more metal layers that are used in forming select devices and interconnects between said devices. The metal layers also provide electrical paths to input and output connections of the integrated circuit. Connections to the inputs and outputs of the integrated circuit are made through bond pads. Bond pads are formed on a top metal layer of the integrated circuit. A bonding process (i.e. the bonding of a ball bond wire to the bond pad) can damage any active circuitry formed under the metal layer upon which the bonding pad is formed. Therefore, present circuit layout rules either do not allow any circuitry to be formed under the bonding pad or only allow limited structures that have to be carefully tested.

Damage under bonding pads can be caused by many reasons but mainly it is due to the stresses which have occurred during bond wire attachment process and the subsequent stresses after packaging. For example, temperature excursions after packaging exert both lateral and vertical forces on the overall structure. The metal layers of integrated circuit are typically made of soft aluminum that are separated from each other by harder oxide layers. The soft aluminum tends to give under the forces while the harder oxide layers do not. This eventually leads to cracks in the oxide layers. Once an oxide layer cracks, moisture can enter causing corrosion of the aluminum layers and eventually failure of the circuit function. Therefore, the bonding process typically requires the real estate below the bond pad serve only as a buffer against damage that occurs during the bonding process. However, as chip designers try and reduce the size of chips it would be desired to able to use the real estate under the bonding pad for active circuits or interconnects.

For the reasons stated above and for other reasons stated below which will become apparent to those skilled in the art upon reading and understanding the present specification, there is a need in the art for an improved integrated circuit that effectively allows for use of the real estate under bonding pads for active circuits and interconnects.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

In one embodiment, a semiconductor structure is provided. The structure comprises a top metal layer, a bond pad formed on the top metal layer, a conductor formed below the top metal layer, and an insulation layer separating the conductor from the top metal layer. The top metal layer includes a sub-layer of relatively stiff material compared to the remaining portion of the top metal layer. The sub-layer of relatively stiff material is configured to distribute stresses over the insulation layer to reduce cracking in the insulation layer.

BRIEF DESCRIPTION OF THE DRAWINGS

The present invention can be more easily understood and further advantages and uses thereof more readily apparent, when considered in view of the description of the preferred embodiments and the following figures in which:

FIG. 2 is a top view of a portion of a metal layer with gaps of one embodiment of the present invention.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal plane" or "lateral plane" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "over," "top" and "under" are defined with respect to the conventional plane or working surface being on the top surface of the wafer or substrate, regardless of the orientation of the wafer or substrate.

Embodiments of the present invention provide a method and structure of an integrate circuit that allows the use of real estate under bonding pads for active devices and interconnects. Moreover, embodiments of the present invention provide a structure that can use all the metal layers below the bond pad for functional interconnections of the device. In addition, embodiments of the present invention also provide a structure that allows submicron interconnects lines with a TiN top layer and relatively wide lines capable of carrying high currents to exist simultaneously under a bond pad.

Figure 1:
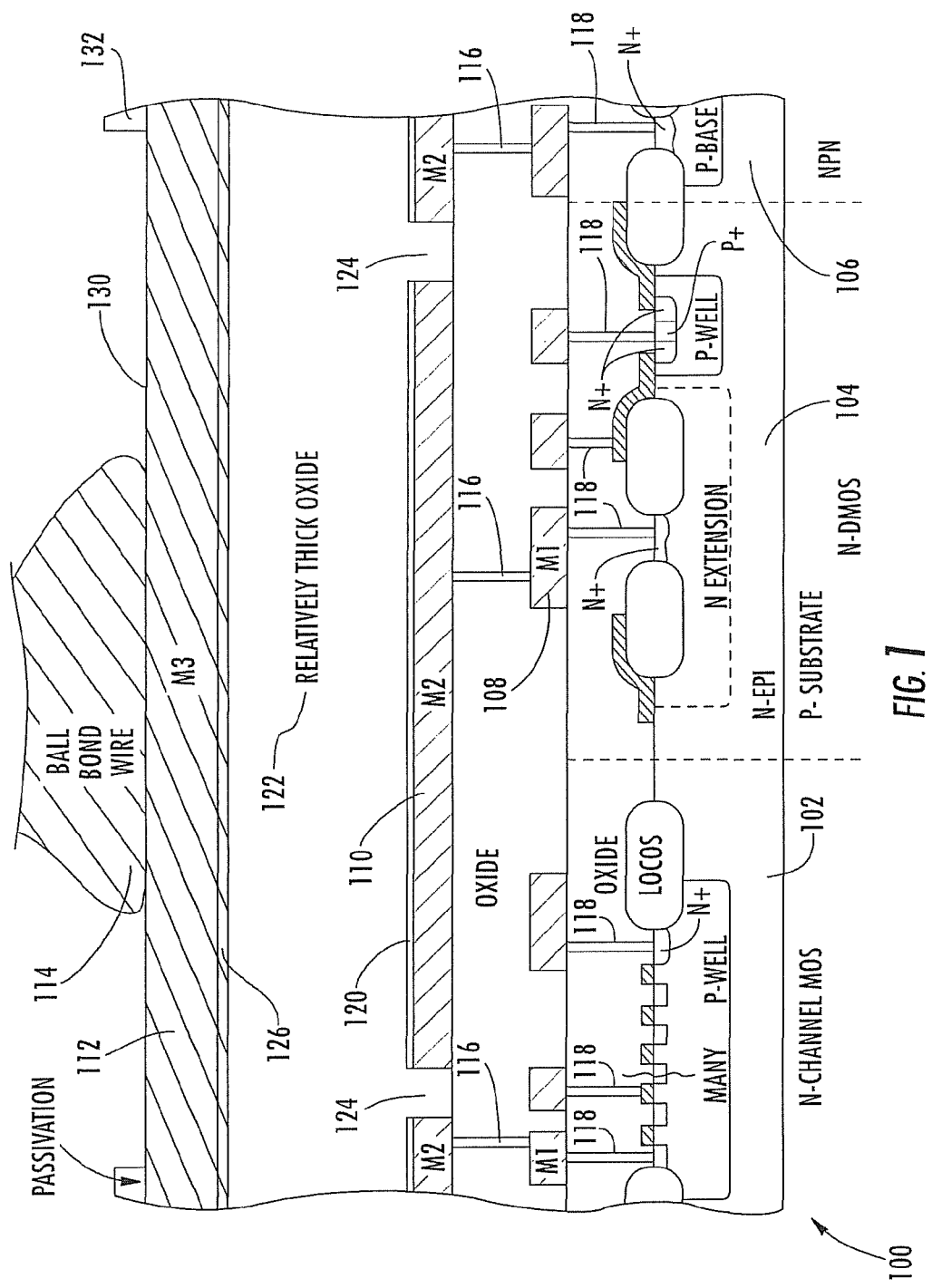
FIG. 1 is a partial cross-sectional view of an integrated circuit of one embodiment of the present invention.

FIG. 1 illustrates a partial cross-section view of an integrated circuit 100 of one embodiment of the present invention. In this embodiment, the part of the integrated circuit 100 shown includes a N-channel MOS power device 102, a N-DMOS device 104 and a NPN bipolar device 106. As FIG. 1 also illustrates three conductive layers, which in this embodiment includes a first metal layer M1 108, a second metal layer M2 110 and a third metal layer M3 112. The metal layers 108, 110, and 112 can be made of conductive material such as aluminum, copper and the like. Moreover, in another embodiment, at least one of the metal layers 108, 110 and 112 is made by a sub-micron process that forms many sub-layers of alternating conductive layers. The third metal layer M3 112 can be referred to as the top metal layer 112. As illustrated, a bond pad 130 is formed on a surface of the third metal layer M3 112 by patterning a passivation layer 132. A ball bond wire 114 (bond wire 114) can be coupled to the bonding pad 130 to provide an input or output to the integrated circuit 100. Although, this embodiment, only illustrates three metal layers 108, 110 and 112, other embodiments have more or less metal layers. For example, in an embodiment with more than three metal layers, additional metal layers are formed between metal layers 108 and 110. Each interconnect metal layer 108, 110 and 112 is formed by conventional methods known in the art such as depositing and patterning.

As illustrated in FIG. 1, vias 116 selectively couple the interconnect metal layers 110 and 108 to form electrical connections between devices 102, 104 and 106 of the integrated circuit 100. Further shown are vias 118 that provide electrical connections to elements of the devices 102, 104 and 106 and the first metal layer 108.

In one embodiment, the sub-micron process is used to form metal layer M2 110 and metal layer M3 112. The sub-micron process uses many sub-layers to form a metal layer. In one embodiment, the sub-layers are alternating layers of Ti, TiN and Al alloys. Further in one embodiment, the top layer of the sub-layers of metal layer 110 (i.e. the sub-layer facing metal 112) is a TiN layer 120. The TiN layer 120 is used in this location because of its low reflective properties that aid in the pattering of metal layer 110. However, the presence of sub-layer 120 tends to increase the probability that cracks will form in an oxide layer separating the metal layer 110 from metal layer 112. In particular, because the TiN layer tends to be hard it doesn't yield when stress is applied. As a result, lateral stresses on the separating oxide tend to form cracks in the separating oxide layer. Further in another embodiment, a layer of TiW forms sub-layer 120.

Embodiments, of the present invention reduce the probability of the cracks forming in the separating oxide layer 122. In one embodiment, the separating oxide layer 122 (i.e. the oxide layer that separates metal layer 110 from metal layer 112) is formed to be relatively thick. In one embodiment, the separating oxide layer 122 is formed to be at least 1.5 um thick. The use of a separating oxide layer 122 that is relatively thick reduces the probabilities of crack forming in the oxide layer 122. In further another embodiment, the separating oxide layer is generally a dielectric or insulating layer.

Moreover in one embodiment, the third metal layer M3 112 includes a relatively hard sub layer 126 of very stiff and hard material. The hard sub-layer 126 is formed adjacent the separating oxide layer 122 and opposite a side of the third metal layer M3 forming the bond pad 114. The hard sub layer 126 is very stiff and hard compared to aluminum. The hard sub layer distributes lateral and vertical stresses over a larger area of the oxide 122 thereby reducing the propensity of cracking in the oxide 122. In one embodiment, the material used for the hard sub-layer 126 is TiN. This is due to the compatibility of TiN with conventional sub-micron deposition and etch techniques. In yet another embodiment, the hard sub-layer 126 is a layer of nitride. In one embodiment, the hard sub-layer 126 is approximately 80 nm in thickness. In further other embodiments, materials such as TiW are used for the hard sub-layer 126.

In further another embodiment, the second metal layer M2 110 is formed to have gaps 124 in selected areas. Very wide (lateral widths) of the second metal layer 110 tend to weaken the structure thus creating a higher chance that cracks will occur in the separating oxide layer 122. In this embodiment, the gaps 124 tend to strengthen the structure by providing pillars of harder oxide. The impact of the gaps 124 on the function of the integrated circuit is minimized by the proper layout. That is, the density of the gaps may be minimized so that a layout design is not constrained significantly. In one embodiment, the gaps 124 take no more than 10% of the total area of the second metal layer M2 110 under the bond pads. In another embodiment, the gaps are oriented such that the impact on current flow through the second metal layer M2 110 is minimized. An example of gaps 124 formed to minimize the impact on the current flow in the second metal layer M2 is illustrated in FIG. 2. FIG. 2, also illustrates the third metal layer 112.

Figure 3A:
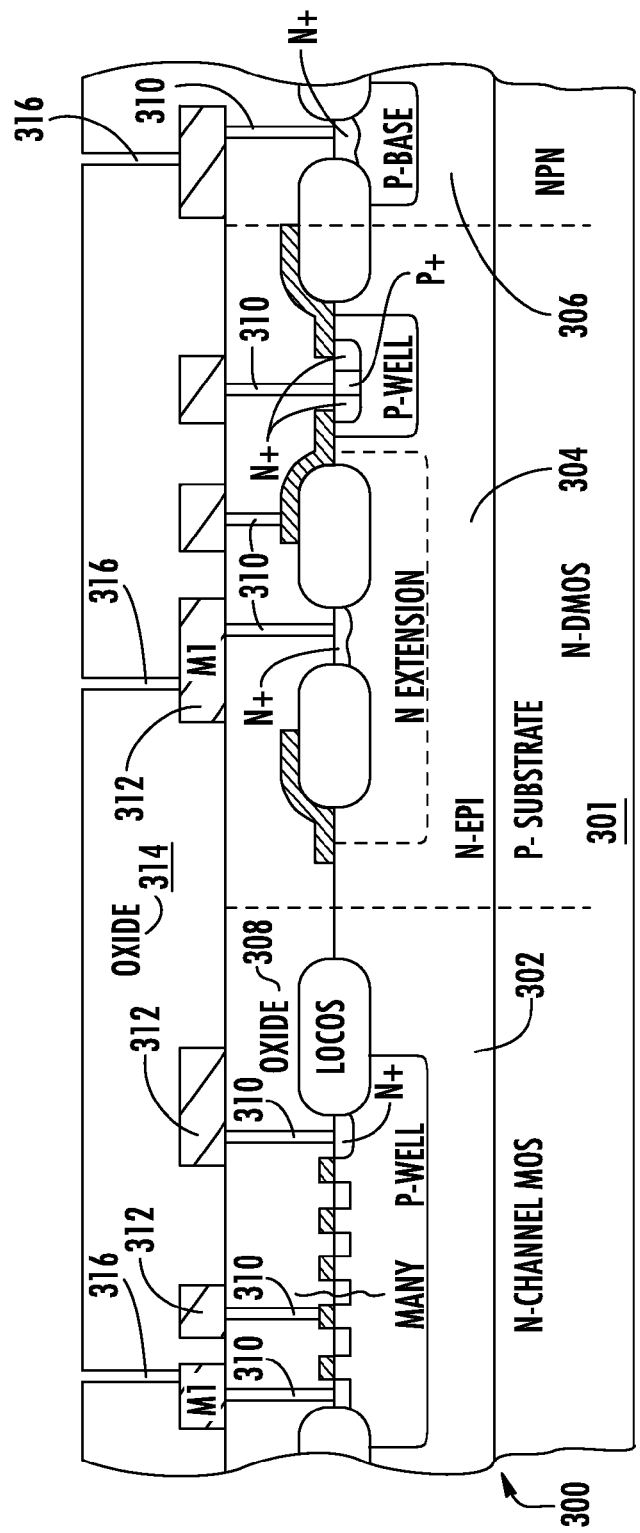
FIGS. 3A through 3G are partial cross-sectional side views of one method of forming an integrated circuit in one embodiment of the present invention.

FIGS. 3A through 3G illustrates the forming of relevant aspects of one embodiment of the present invention. FIG. 3A illustrates a partial cross-sectional side view of the start of the formation of an integrated circuit 300 on a substrate 301. The partial cross-sectional side view illustrates that integrated circuit 300 in this embodiment includes a N-Channel MOS 302, a N-DMOS 304 and a NPN device 306. It will be understood in the art that other types of devices can be formed in the integrated circuit 300 and that the present invention is not limited to only integrated circuits with N-Channel MOS, a N-DMOS and NPN devices. Since the formation of the devices 302, 304 and 306 are not a critical part of the present invention, FIG. 3A illustrates that they are already formed. These devices 302, 304 and 306 are formed by techniques known in the art such as deposition, etching masking and implantation. A first insulating layer 308 is formed overlaying devices 302, 304 and 306. In one embodiment, the insulating layer 308 is a layer of first oxide layer 308. Vias 310 are formed by techniques known in the art such as masking and etching. The vias 310 are then filled with conductive material to form contacts with the first metal layer 312 and elements of the devices 302, 304 and 306. The first metal layer 312 is formed by first depositing a metal layer and then patterning the first metal layer 312 to form select interconnects. A second insulating layer 314 is then formed overlaying the first metal layer M1 312 and exposed areas of the first oxide layer 308. In one embodiment, the second insulting layer 314 is a second oxide layer 314. Vias are formed in the second layer of oxide 314 by masking a surface of the second layer of oxide and etching the vias 316 down to select portions of the patterned first metal layer 312. The vias 316 are then filled with conductive material.

Figure 3B:
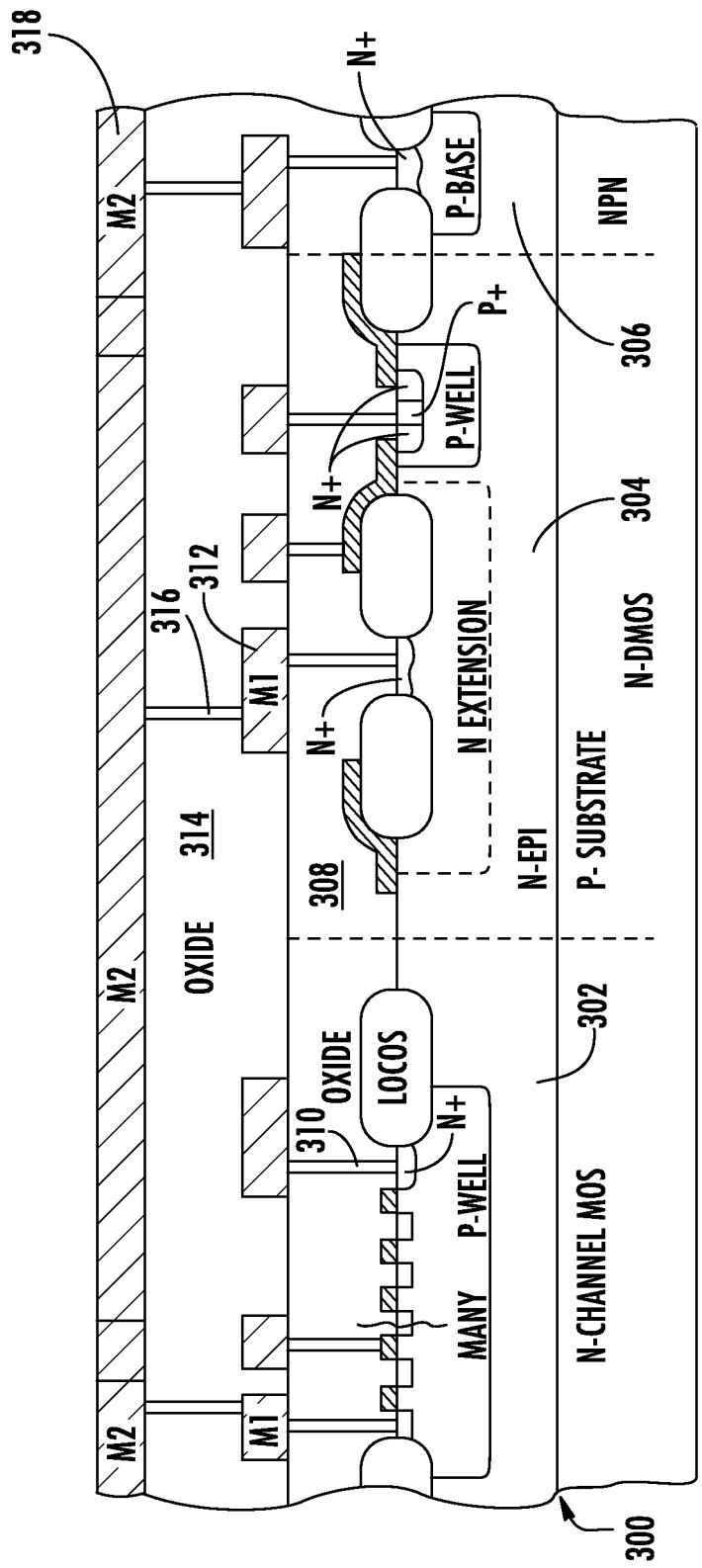
Figure 3C:
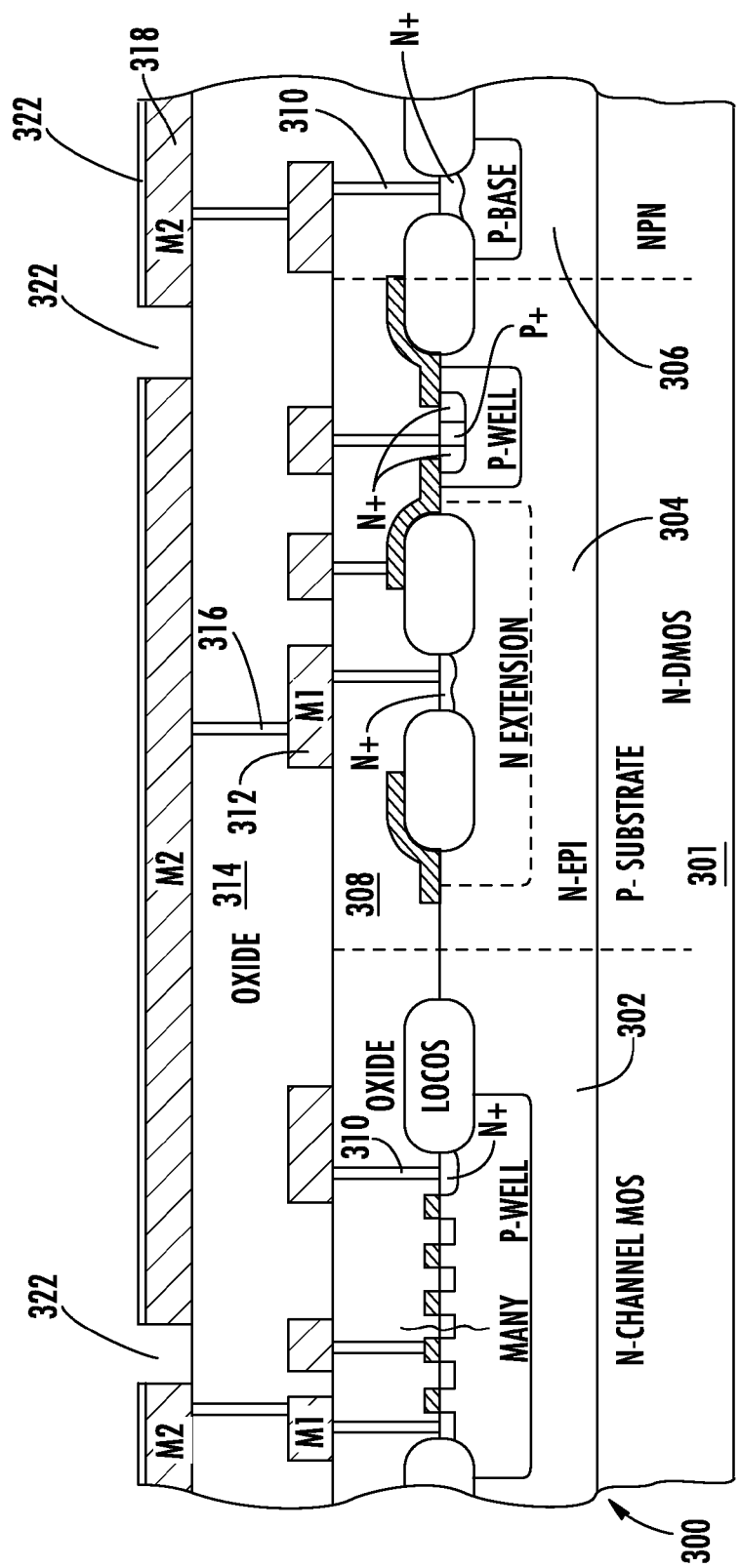
Figure 3D:
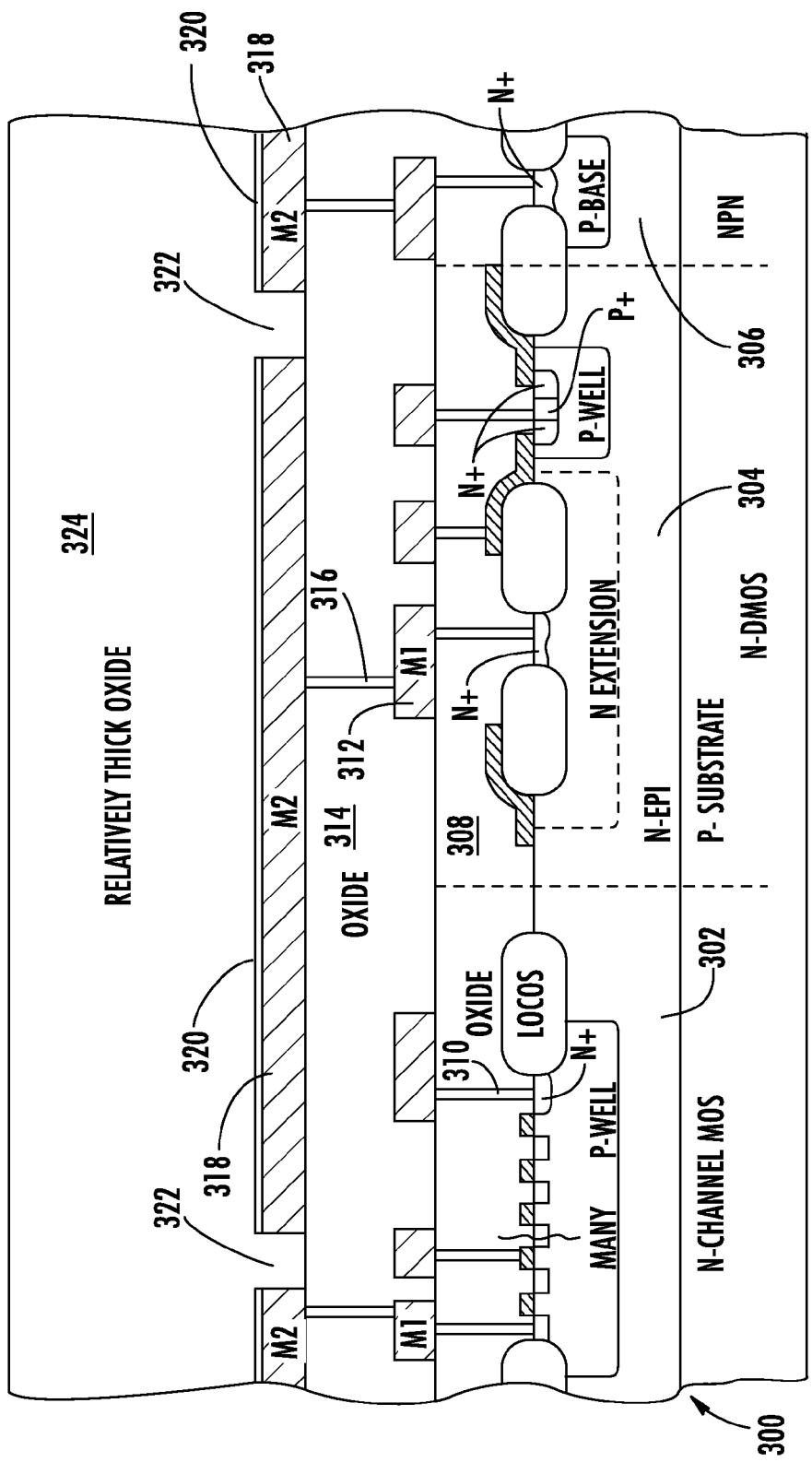

Referring to FIG. 3B, a second metal layer M2 318 is deposited on a surface of the second oxide layer. In one embodiment, the second metal layer 318 is formed by a sub-micron process comprising a plurality of alternating layers of different metals. In one embodiment, the alternating layers of metal are Ti, TiN and Al alloys. A top sub layer 320 of the second metal layer M2 318 is made of TiN which aids in the pattering of the second metal layer M2 318. The top sub layer 320 is illustrated in FIG. 3C. As illustrated in FIG. 3C, in this embodiment, the second metal layer 318 is then patterned to form gaps 322. The gaps 322 strengthen the structure by providing pillars of hard oxide. A third insulating layer 324 is then formed overlaying the second metal layer M2. This is illustrated in FIG. 3D. In one embodiment, the third insulating layer 324 is a third oxide layer 324. The third oxide layer 324 also fills in the gaps 322. In one embodiment, the third oxide layer 324 (separating oxide layer 324) is formed to be relatively thick. Moreover, in one embodiment the thickness of the separating oxide layer 324 is at least 1.5 um.

Figure 3E:
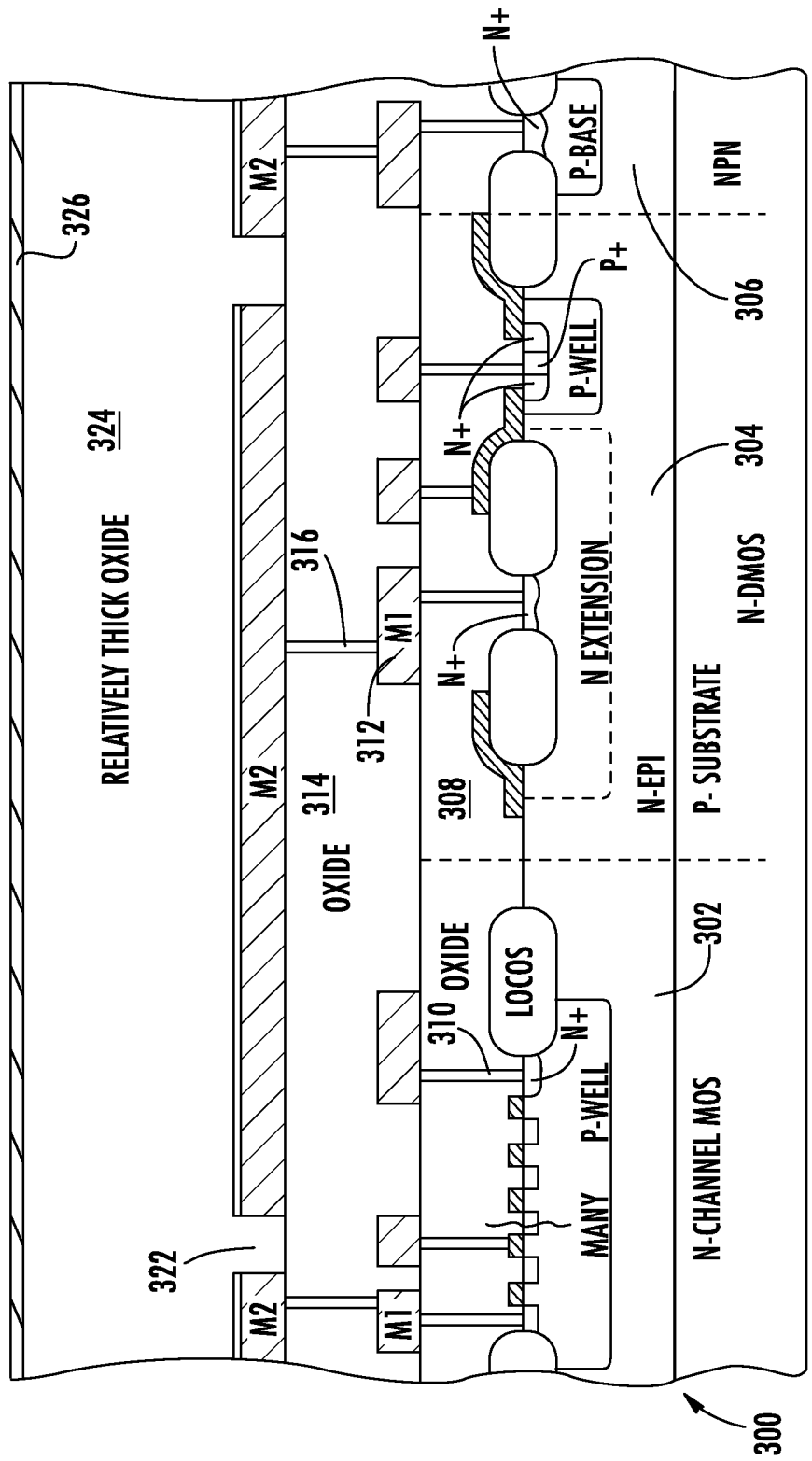
Figure 3F:
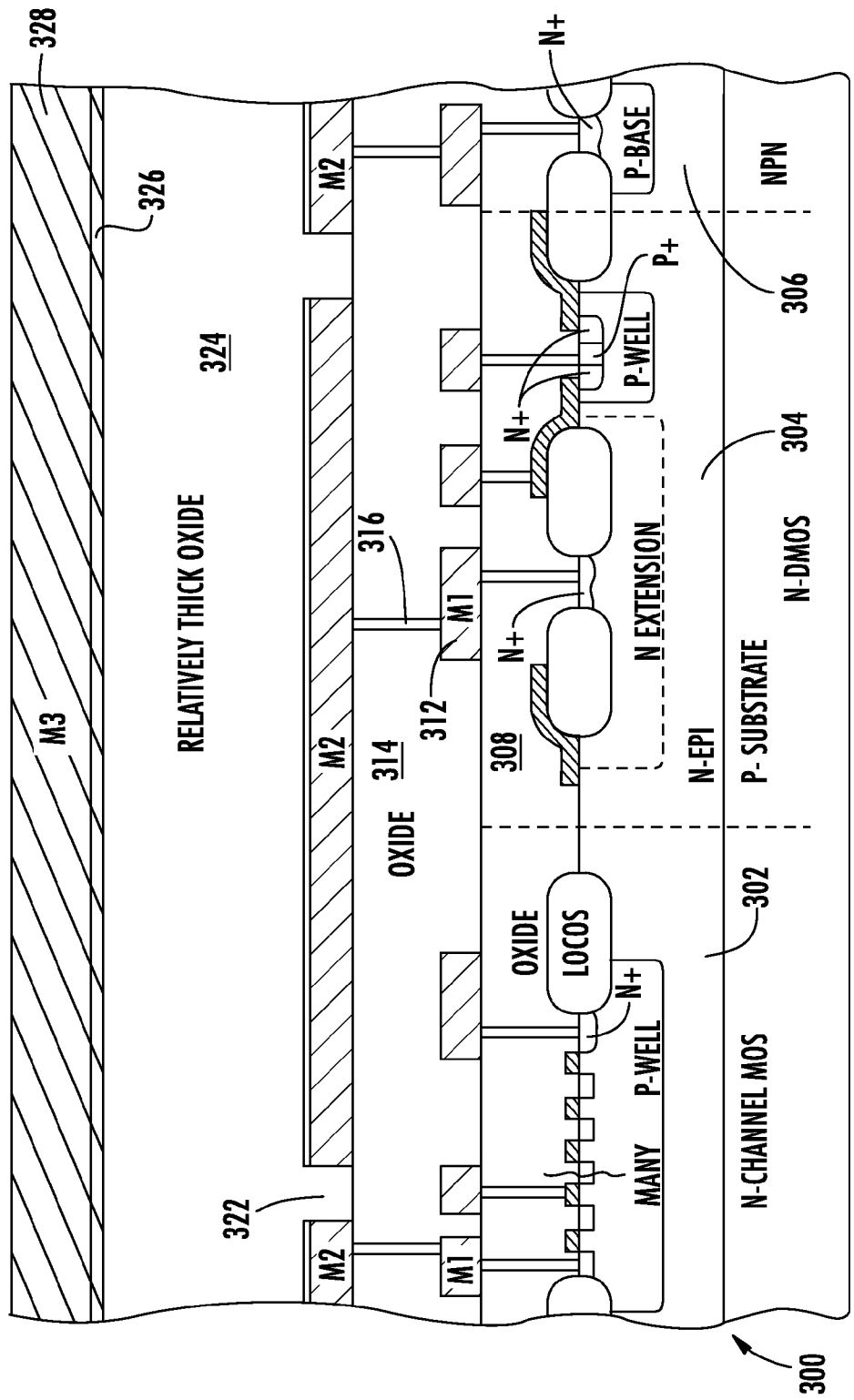
Figure 3G:
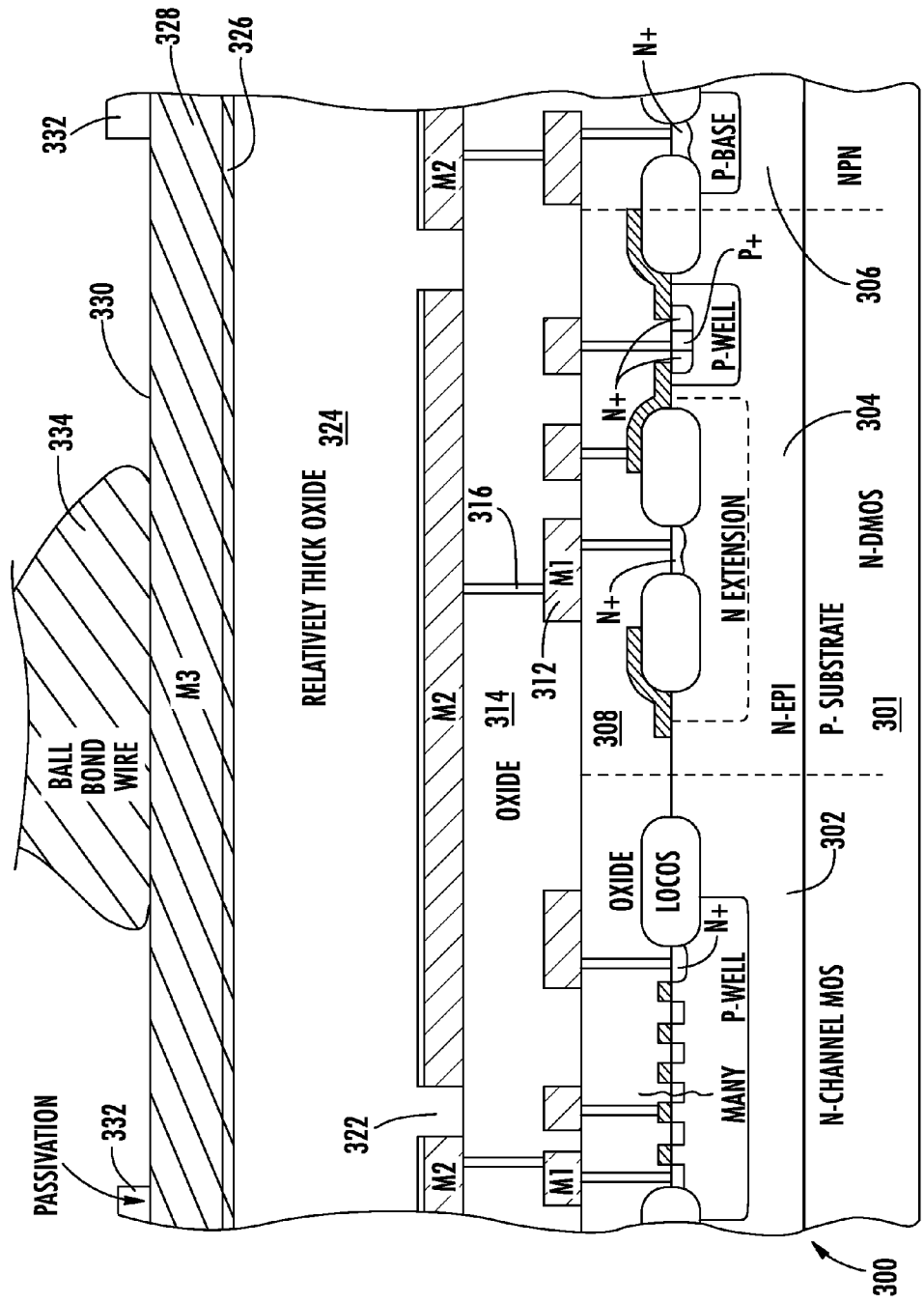

A layer of relatively stiff and hard metal layer 326 is then formed on the surface of the separating oxide layer 324. This is illustrated in FIG. 3E. This hard layer 326 distributes both lateral and vertical stress is over a larger area of the separating oxide layer 324. Some embodiments of the hard layer 326 are formed by a layer of nitride such as TiN or SiN. In yet another embodiment the hard layer 326 is formed by a layer of TiW. Moreover, in one embodiment, the hard layer 326 is formed to be approximately 80 nm in thickness. Referring to FIG. 3F the third metal layer M3 328 is formed overlaying hard layer 326. In one embodiment, the hard layer 326 is a sub layer formed during the formation of the third metal layer M3 328 by conventional sub-micron deposition and etch techniques. In still another embodiment (not shown), the hard layer 326 is a sub layer of the third metal layer M3 328 formed near the separating oxide layer 324. A bond pad 330 is then formed on an upper surface of the third metal layer M3 328 by patterning a deposited passivation layer 332. This is illustrated in FIG. 3G. Further as illustrated in FIG. 3G, a ball bond wire 334 is then coupled to the bond pad 330. Although, not shown in the Figures, vias are formed in the relatively thick oxide 324 so that the top metal layer 328 can also be used to interconnect devices. Moreover, it will be understood in the art that a single integrated circuit may have multiple bond pads and the present invention is not limited to a single bond pad.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A semiconductor structure, the structure comprising:
    a top metal layer, the top metal layer including a sub-layer of relatively stiff material compared to the remaining portion of the top metal layer,
    a bond pad formed on the top metal layer;
    a conductor formed below the top metal layer; and
    an insulation layer separating the conductor from the top metal layer;
    wherein the sub-layer of relatively stiff material is configured to distribute stresses over the insulation layer to reduce cracking in the insulation layer.

2. The semiconductor structure of claim 1, wherein the sub-layer extends under the bond pad to cover an area at least as large as the area under the bond pad.

3. The semiconductor structure of claim 1, wherein the insulation layer has a thickness selected to resist cracking due to vertical and horizontal stresses on the semiconductor structure.

4. The semiconductor structure of claim 1, wherein the insulation layer has a thickness that resists formation of cracks due to stresses caused by at least one of a bond wire attachment process or temperature excursions.

5. The semiconductor structure of claim 1, wherein the conductor is patterned with gaps.

6. The semiconductor structure of claim 5, wherein the gaps extend in a direction of current flow through the conductor.

7. A method of forming a semiconductor structure comprising:
    forming a top metal layer, wherein forming the top metal layer includes forming a sub-layer of the top of metal layer, the sub-layer being relatively stiff compared to the remaining portion of the top metal layer,
    forming a bond pad on a surface of the top metal layer;
    forming a conductor below the top metal layer; and
    forming an insulation layer separating the conductor from the top metal layer;
    wherein the sub-layer of relatively stiff material is configured to distribute stresses over the insulation layer to reduce cracking in the insulation layer.

8. The method of claim 7, wherein forming the sub-layer comprises forming the sub-layer under the bond pad to extend over an area at least as wide as the area under the bond pad.

9. The method of claim 7, wherein forming the insulation layer comprises forming the insulation layer with a thickness selected to resist cracking due to vertical and horizontal stresses on the semiconductor structure.

10. The method of claim 7, wherein forming the insulation layer comprises forming the insulation layer with a thickness that resists formation of cracks due to stresses caused by at least one of a bond wire attachment process or temperature excursions.

11. The method of claim 7, further comprising patterning the conductor with gaps.

12. The method of claim 11, wherein patterning the conductor with gaps comprises patterning the gaps to extend in a direction of current flow through the conductor.

13. A semiconductor structure comprising:
    at least one electrical device in a substrate;
    one or more intermediate metal layers between a top metal layer and the substrate;
    one or more insulation layers, the one or more insulation layers separating the one or more intermediate metal layers and the top metal layer; and
    a passivation layer over the top metal layer; the passivation layer patterned to form a bond pad on a surface of the top metal layer, wherein the at least one electrical device is located directly under the bond pad; and
    wherein one of the one or more insulation layers is located adjacent to the top metal layer and has a thickness selected to resist cracking due to stresses caused by at least one of a bond wire attachment process or temperature excursions.

14. The semiconductor structure of claim 13, wherein the one insulation layer of the one or more insulation layers that has a thickness selected to resist cracking is relatively thicker than the remaining insulation layers of the one or more insulation layers.

15. The semiconductor structure of claim 13, wherein the one insulation layer of the one or more insulation layers that has a thickness selected to resist cracking has a thickness of at least 1.5 μm.

16. The semiconductor structure of claim 13, wherein the top metal layer further comprises a sub-layer of the top metal layer, the material of the sub-layer being relatively stiff compared to remaining portions of the top metal layer.

17. The semiconductor structure of claim 13, wherein a conductor formed from a segment of an intermediate metal layer that is adjacent to the one insulation layer that is adjacent to the top metal layer has at least one gap, at least a portion of the conductor formed directly under the bond pad.

18. The semiconductor structure of claim 17, wherein the at least one gap extends in a direction of current flow through the conductor.

19. The semiconductor structure of claim 13, further comprising:
   one or more vias formed in the one insulation layer that is located adjacent to the top metal layer to interconnect the at least one electrical device with the top metal layer.

* * * * *